(12) United States Patent
Hanada

(10) Patent No.: US 8,981,542 B2
(45) Date of Patent: Mar. 17, 2015

(54) SEMICONDUCTOR POWER MODULE AND METHOD OF MANUFACTURING THE SAME

(71) Applicant: Rohm Co., Ltd., Kyoto (JP)

(72) Inventor: Toshio Hanada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/957,690

(22) Filed: Aug. 2, 2013

(65) Prior Publication Data

US 2013/0313574 A1    Nov. 28, 2013

Related U.S. Application Data

(63) Continuation of application No. 13/247,105, filed on Sep. 28, 2011, now Pat. No. 8,525,315.

(30) Foreign Application Priority Data

Sep. 29, 2010    (JP) ................................ 2010-219030

(51) Int. Cl.
*H01L 23/02* (2006.01)
*H01L 23/498* (2006.01)
(Continued)

(52) U.S. Cl.
CPC ........ *H01L 23/49866* (2013.01); *H01L 23/043* (2013.01); *H01L 24/32* (2013.01); *H01L 24/33* (2013.01); *H01L 24/83* (2013.01); *H01L 25/18* (2013.01); *H01L 24/45* (2013.01); *H01L 24/48* (2013.01); *H01L 24/49* (2013.01); *H01L 25/072* (2013.01); *H01L 2224/32* (2013.01); *H01L 2224/45124* (2013.01); *H01L 2224/48157* (2013.01); *H01L 2224/49175* (2013.01); *H01L 2924/01013* (2013.01); *H01L 2924/01029* (2013.01); *H01L 2924/10272* (2013.01); *H01L 2924/16151* (2013.01); *H01L 2924/01005* (2013.01); *H01L 2924/01006* (2013.01); *H01L 2924/01019* (2013.01);
(Continued)

(58) Field of Classification Search
USPC .......... 257/678, 706, 177, 675, 734, E23.052, 257/E23.178, 724, 726, 785
See application file for complete search history.

(56) References Cited

U.S. PATENT DOCUMENTS 5,539,220 A    7/1996    Takahashi
5,635,427 A    6/1997    Takahashi
(Continued)

FOREIGN PATENT DOCUMENTS

| JP | 7-94673 | 4/1995 |
|---|---|---|
| JP | 2006-186035 | 7/2006 |
| JP | 2007-281274 | 10/2007 |
| JP | 2007-305962 A | 11/2007 |
| JP | 2008-42041 | 2/2008 |
| JP | 2010-140969 | 6/2010 |

*Primary Examiner* — Jasmine Clark
(74) *Attorney, Agent, or Firm* — Rabin & Berdo, P.C.

(57) ABSTRACT

A semiconductor power module according to the present invention includes a base member, a semiconductor power device having a surface and a rear surface with the rear surface bonded to the base member, a metal block, having a surface and a rear surface with the rear surface bonded to the surface of the semiconductor power device, uprighted from the surface of the semiconductor power device in a direction separating from the base member and employed as a wiring member for the semiconductor power device, and an external terminal bonded to the surface of the metal block for supplying power to the semiconductor power device through the metal block.

14 Claims, 10 Drawing Sheets

(51) Int. Cl.
*H01L 23/043* (2006.01)
*H01L 23/00* (2006.01)
*H01L 25/18* (2006.01)
*H01L 25/07* (2006.01)

(52) U.S. Cl.
CPC .............. *H01L 2924/01033* (2013.01); *H01L 2924/014* (2013.01); *H01L 2924/0132* (2013.01); *H01L 2224/83* (2013.01)
USPC .......... 257/678; 257/177; 257/675; 257/734; 257/E23.052; 257/E23.178

(56) References Cited

U.S. PATENT DOCUMENTS

| | | | |
|---|---|---|---|
| 6,917,103 | B2 | 7/2005 | Hirano et al. |
| 7,250,672 | B2 * | 7/2007 | Pavier et al. .................. 257/691 |
| 7,470,939 | B2 * | 12/2008 | Mochida et al. .............. 257/177 |
| RE43,663 | E | 9/2012 | Kawashima et al. |
| 2007/0262387 | A1 | 11/2007 | Nonaka et al. |

\* cited by examiner

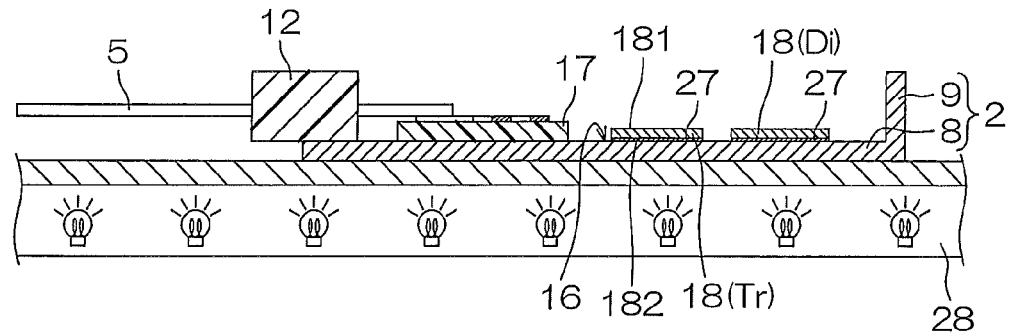
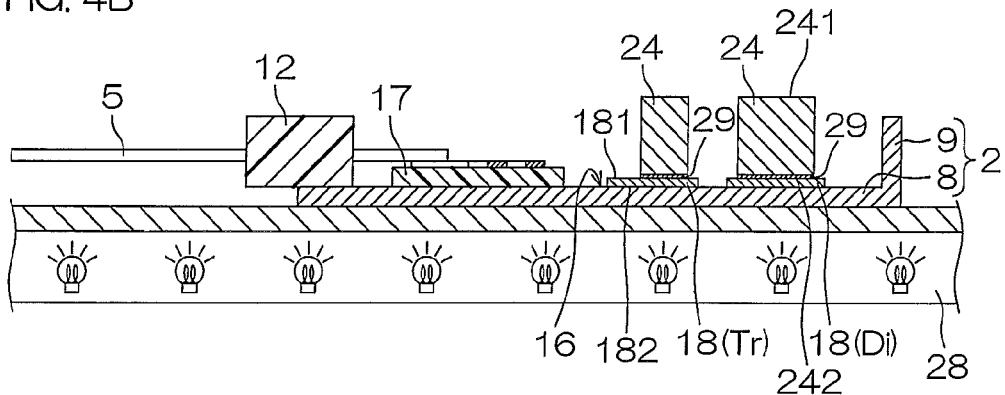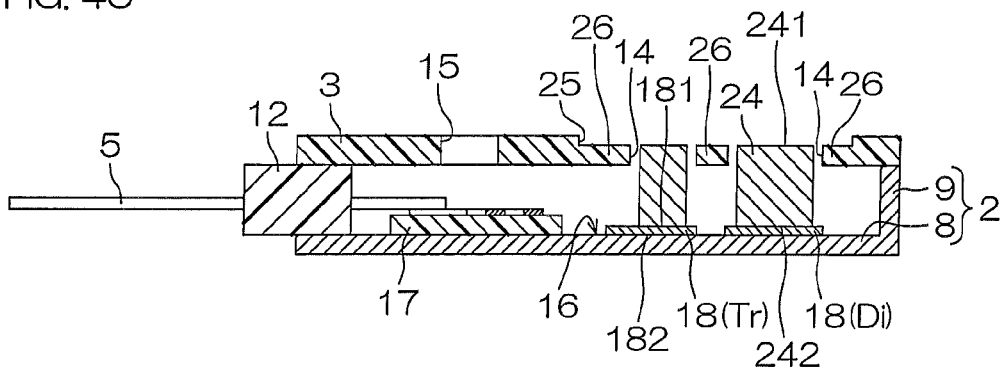

US 8,981,542 B2

SEMICONDUCTOR POWER MODULE AND METHOD OF MANUFACTURING THE SAME

This is a Continuation of U.S. application Ser. No. 13/247,105, filed on Sep. 28, 2011, and allowed on May 14, 2013 as U.S. Pat. No. 8,525,315, the subject matter of which is incorporated herein by reference.

BACKGROUND OF THE INVENTION

1. Field of the Invention

The present invention relates to a semiconductor power module and a method of manufacturing the same.

2. Description of Related Art

A semiconductor power module is an apparatus loaded with a plurality of semiconductor power devices for obtaining an output from the semiconductor power devices electrically connected with one another. Such a semiconductor power module is employed for an inverter circuit constituting a driver circuit for driving an electric motor, for example. The electric motor is employed as a power source for an electric car (including a hybrid car), an electric train or an industrial robot, for example. The semiconductor power module is also applied to an inverter circuit converting power generated by a power generator (particularly a private power generator) such as a solar cell or a wind power generator to match with the power of a commercial power source.

The semiconductor power devices loaded on the semiconductor power module are connected to an external terminal of the semiconductor power module through wires.

For example, a semiconductor power module disclosed in FIG. 1 of Patent Document 1 (Japanese Unexamined Patent Publication No 2007-305962) includes a circuit board having a structure obtained by integrating a metal substrate electrode, an insulated substrate and a heat sink with one another, a plurality of SiC semiconductor power devices connected onto the metal substrate electrode of the circuit board, a case fixed to the heat sink for storing the SiC semiconductor power devices, and an external electrode mounted on the case. The SiC semiconductor power devices and the external electrode are connected with one another through Al wires.

SUMMARY OF THE INVENTION

The Al wires connected to the semiconductor power devices must feed high current operated by the semiconductor power devices. In general, therefore, a plurality of Al wires are bonded to each semiconductor power device.

Even if a plurality of Al wires are bonded to each semiconductor power device, however, the bonding area between each Al wire and the semiconductor power device is so small that current concentrates on the junction between the Al wire and the semiconductor power device. The waveform of the current is disturbed due to the current concentration, to disadvantageously result in local heat generation in the semiconductor power device. While the heat generated in the semiconductor power device is partially released through the Al wire, the heat releasing effect is insufficient if the diameter of the Al wire is small.

When the number of the Al wires connected to each semiconductor power device is increased thereby ensuring large bonding areas, a sufficient heat releasing effect may be attained. However, the pitch of the Al wires connected to the semiconductor power device is limited, and hence the heat releasing effect is desirably improved by another technique.

Accordingly, a principal object of the present invention is to provide a semiconductor power module capable of leveling current flowing from a semiconductor power device and capable of efficiently releasing heat generated in the semiconductor power device and a method of manufacturing the same.

Another object of the present invention is to provide a method of manufacturing a semiconductor power module, capable of simply manufacturing a semiconductor power module capable of leveling current flowing from a semiconductor power device and capable of efficiently releasing heat generated in the semiconductor power device with high quality.

The foregoing and other objects, features and effects of the present invention will become more apparent from the following detailed description of the embodiments with reference to the attached drawings.

BRIEF DESCRIPTION OF THE DRAWINGS

FIGS. 4A to 4E are sectional views, taken along the cutting plane line A-A in FIG. 1 similarly to FIG. 3, successively showing partial manufacturing steps for the semiconductor power module shown in FIG. 1.

DETAILED DESCRIPTION OF PREFERRED EMBODIMENTS

Figure 1:
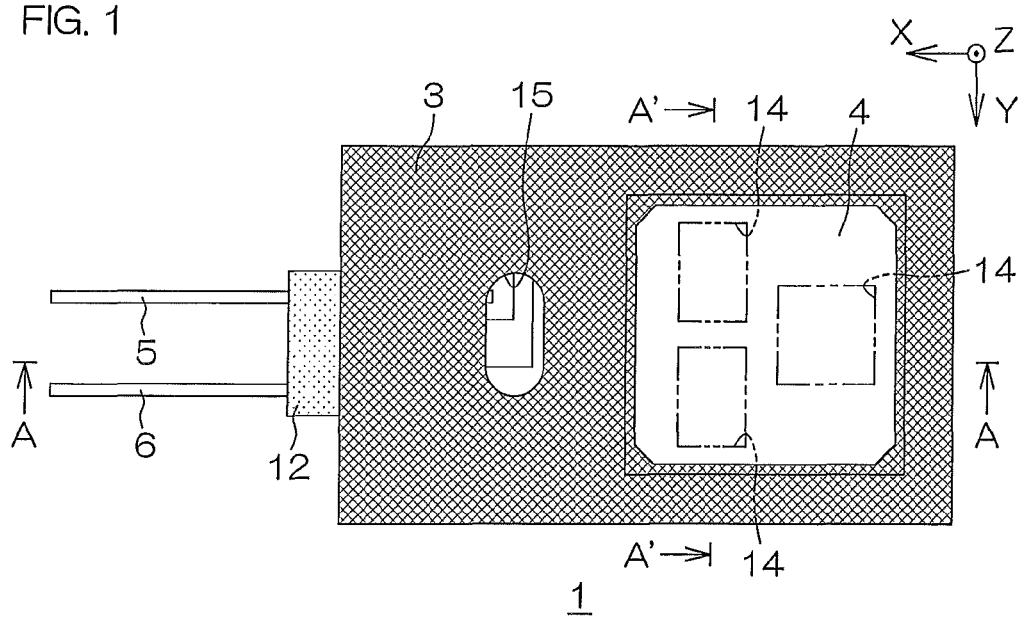
FIG. 1 illustrates the overall structure of a semiconductor power module according to a first embodiment of the present invention.
Figure 1:
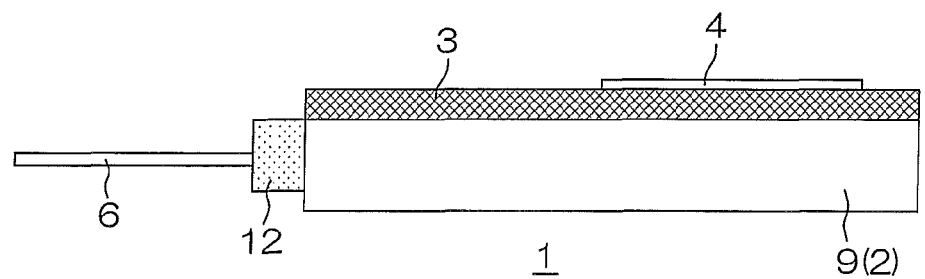
Figure 1:
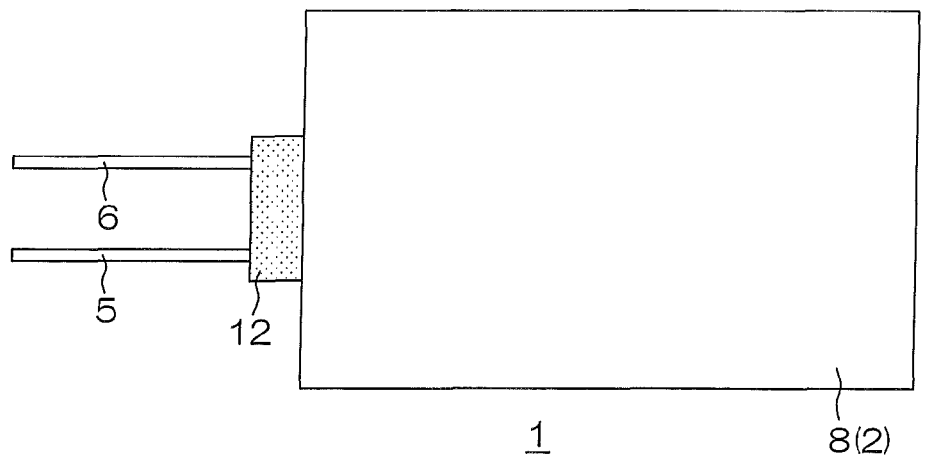

A semiconductor power module according to an aspect of the present invention includes a base member, a semiconductor power device having a surface and a rear surface with the rear surface bonded to the base member, a metal block, having a surface and a rear surface with the rear surface bonded to the surface of the semiconductor power device, uprighted from the surface of the semiconductor power device in a direction separating from the base member and employed as a wiring member for the semiconductor power device, and an external terminal bonded to the surface of the metal block for supplying power to the semiconductor power device through the metal block.

According to this structure, the metal block having a larger diameter than a wire is employed as the wiring member connecting the semiconductor power device and the external terminal of the semiconductor power module with each other. Thus, a wire can be bonded to the semiconductor power device with a large area. Therefore, the junction between the wire (the metal block) and the semiconductor power device can be prevented from current concentration. Consequently, current can be leveled. Further, heat generated in the semiconductor power device can be efficiently released, whereby a heat releasing effect can also be improved.

Preferably, the semiconductor power module according to the present invention further includes a case having a base portion provided with a device region where the semiconductor power device is arranged and a frame portion fixed to the base portion for surrounding the device region, and a top plate, made of resin, fixed to the frame portion of the case and opposed to the device region, while the external terminal includes a plate terminal provided along the top plate, and the top plate has a support portion overlapping with the plate terminal in plan view for supporting the plate terminal from the side of a rear surface thereof.

When the external terminal is the plate terminal provided along the top plate blocking the case and the plate terminal is subjected to an external shock or the like, the shock may be transmitted to the semiconductor power device through the metal block, to break the semiconductor power device as a result.

According to this structure, therefore, the top plate has the support portion supporting the plate terminal from the side of the rear surface thereof. Even if the plate terminal is subjected to a shock or the like, therefore, the support portion can absorb the shock. Consequently, the semiconductor power device can be absolutely protected against transmission of the shock, or the shock transmitted to the semiconductor power device can be reduced. Therefore, the semiconductor power device can be prevented from breakage caused by the shock.

Preferably in the semiconductor power module according to the present invention, an opening smaller than the plane area of the plate terminal is formed in a region of the top plate opposed to the plate terminal, the metal block is bonded to the plate terminal through the opening, and the support portion of the top plate includes a peripheral edge portion of the opening surrounding the metal block in the top plate.

According to this structure, the support portion constituted of the peripheral edge portion of the opening surrounding the metal block can effectively absorb a shock transmitted from the plate terminal to the metal block.

Preferably in the semiconductor power module according to the present invention, the top plate is a member provided to be separable from the frame portion.

According to this structure, the top plate is separable from the frame portion. In order to manufacture the semiconductor power module, therefore, the semiconductor power device is first arranged on the device region so that the metal block can be bonded to the semiconductor power device while e the top plate is separated from the frame portion. Therefore, the semiconductor power module can be manufactured with excellent workability.

Preferably in the semiconductor power module according to the present invention, the top plate is formed in a U shape in plan view having an open end on a position on one side with respect to the plate terminal and having a blocked end on a position on a side opposite to the open end with respect to the plate terminal, and supported by the frame portion to be slidable in a sliding direction along a direction where the blocked end separates from the plate terminal, the metal block is bonded to the plate terminal in a region surrounded by the top plate between the open end and the blocked end, and the support portion of the top plate includes an edge portion of the region in the top plate.

According to this structure, the top plate is slidably supported by the frame portion, and separable from the frame portion. In order to manufacture the semiconductor power module, therefore, the semiconductor power device is first arranged on the device region so that the metal block can be bonded to the semiconductor power device while the top plate is separated from the frame portion. Therefore, the semiconductor power module can be manufactured with excellent workability. Further, an end portion of the top plate opposite to the direction where the same is extracted by sliding forms the open end. Also after the top plate is fixed to the frame portion, therefore, the device region can be exposed by extracting the top plate without detaching the metal on from the plate terminal. Consequently, maintenance in the case can be easily performed.

Further, the support portion constituted of the edge portion surrounding the region where the metal block is arranged can effectively absorb a shock transmitted from the plate terminal to the metal block.

Preferably in the semiconductor power module according to the present invention, the plate terminal is in the form of a quadrangle in plan view having a pair of first opposite sides extending along the sliding direction and a pair of second opposite sides orthogonal to the first opposite sides, the top plate has a pair of arm portions along the first opposite sides and a coupling portion coupling sides of the pair of arm portions in the sliding direction with each other, and is provided to surround three sides in the periphery of the plate terminal with the arm portions and the coupling portion, the pair of arm portions have first portions coming into contact with the peripheral edge portion of the plate terminal from outside in a transverse direction orthogonal to the sliding direction and second portions projecting from lower ends of the first portions along the rear surface of the plate terminal respectively, and the peripheral edge portion of the plate terminal along the first opposite sides fits into a recess portion partitioned by the first portions of the arm portions and the second portions of the arm portions.

According to this structure, the peripheral edge portion of the plate terminal along the first opposite sides fits into the recess portion partitioned by the first portions of the arm portions and the second portions of the arm portions. When the top plate is slid along the frame portion, therefore, the plate terminal can he utilized as a guide member for guiding the top plate. Thus, the top plate can be easily positioned.

Preferably in the semiconductor power module according to the present invention, the coupling portion has a first portion coming into contact with the peripheral edge portion of the plate terminal from outside in the sliding direction and a second portion projecting from a lower end of the first portion along the rear surface of the plate terminal, and the peripheral edge portion of the plate terminal along the second opposite sides fits into a recess portion partitioned by the first portion of the coupling portion and the second portion of the coupling portion.

According to this structure, the peripheral edge portion of the plate terminal along the second opposite sides (the opposite sides orthogonal to the sliding direction) fits into the recess portion partitioned by the first portion of the coupling portion and the second portion of the coupling portion. When the top plate is slid along the frame portion, therefore, the sliding of the top plate can be stopped by bringing the peripheral edge portion of the plate terminal into contact with the first portion of the coupling portion of the top plate. In other words, the plate terminal can also be utilized as a stopper member for stopping the sliding of the top plate. Therefore, the top plate can be more easily positioned.

Preferably in the semiconductor power module according to the present invention, both of the base portion and the frame portion are made of a metal, the base portion serves also as the base member supporting the semiconductor power device, and the frame portion serves also as a second external terminal for supplying power to the semiconductor power device through the base portion.

According to this structure, the frame portion uprighted from the base portion serves al so as the second external terminal, whereby electrical contact with the rear surface of the semiconductor power device can be attained from the side of the surface of the semiconductor power module.

In the semiconductor power module according to the present invention, the semiconductor power device may be a device employing an SiC semiconductor.

In this case, the metal block is preferably made of Cu or an alloy material containing Cu.

According to this structure, the difference between the linear expansion coefficients of SiC and the wiring member can be reduced as compared with a case of employing an Al wire as the wiring member for the semiconductor power device. Therefore, thermal stress caused between the semiconductor power device and the wiring member can be reduced. Consequently, thermal fatigue of the semiconductor power device can be reduced, whereby a semiconductor power module having a long life and high reliability can be attained. The alloy material containing Cu can be prepared from a CuMo alloy or a CuW alloy, for example.

For example, the linear expansion coefficient of SiC is about 4.5 ppm/K, and that of a CuMo alloy is about 9.0 ppm/K (about twice the linear expansion coefficient of Sic). On the other hand, the linear expansion coefficient of Al is about 23 ppm/K (about five times the linear expansion coefficient of Sic).

The metal block may be in the form of a rectangular parallelepiped, or may have a tapered shape whose sectional area spreads from the rear surface toward the surface thereof.

If the metal block has a tapered shape, heat generated in the semiconductor power device can be released with the optimum heat releasing efficiency when designing the area of the rear surface of the metal block in response to the surface area of the semiconductor power device and designing the area of the surface of the metal block in response to the size of the external terminal.

The semiconductor power module according to the present invention may be provided with a plurality of semiconductor power devices, and the external terminal may be collectively bonded to the metal block bonded to each of the semiconductor power devices.

Preferably in the semiconductor power module according to the present invention, the top plate is provided with a through-hole passing through the top plate in the thickness direction in a region other than a region overlapping with the plate terminal in plan view.

According to this structure, an insulated state in the case can be simply maintained by pouring resin into the case from the through-hole formed in the top plate.

A method of manufacturing a semiconductor power module according to another aspect of the present invention includes the steps of bonding a rear surface of a semiconductor power device having a surface and the rear surface to a base member, bonding a rear surface of a metal block, having a surface and the rear surface, employed as a wiring member for the semiconductor power device to the surface of the semiconductor power device after bonding the base member and the semiconductor power device to each other, performing preliminary soldering on an external terminal, for supplying power to the semiconductor power device, and bonding the external terminal and the metal block to each other by bringing the metal block into contact with a portion of the external terminal subjected to the preliminary soldering and heating the external terminal.

When the metal block having a high heat releasing effect is utilized as the wiring material for the semiconductor power device as in the present invention, heat may be released through the metal block having a high heat releasing effect if the side of the external terminal is merely heated while a solder material is held between the metal block and the external terminal. Consequently, the previously held solder material may not be excellently melted, but the metal block and the external terminal may be defectively bonded to each other.

According to the inventive manufacturing method, therefore, the preliminary soldering is previously performed on the external terminal, and the metal block is brought into contact with and bonded to the portion subjected to the preliminary soldering. Thus, the metal block and the external terminal can be excellently bonded to each other. In other words, a semiconductor power device such as that according to the present invention can be simply manufactured with high quality.

Preferably in the method of manufacturing a semiconductor power module according to the present invention, the external terminal is a plate terminal in the form of a flat plate, and the step of performing the preliminary soldering includes a step of piling not less than a prescribed volume of solder on the plate terminal.

According to this structure, the solder of not less than the prescribed volume can compensate for a vertical difference caused between a plurality of metal blocks.

Embodiments of the present invention are now described in detail with reference to the attached drawings.

<First Embodiment>

FIG. 1 illustrates the overall structure of a semiconductor power module according to a first embodiment of the present invention.

A semiconductor power module 1 includes a case 2 having an open surface, a top plate 3 blocking the open surface of the case 2, a source terminal 4 as an external terminal, a source sensing terminal 5, and a gate terminal 6.

For the convenience of illustration, directions X, Y and Z shown in FIG. 1 may hereinafter be employed. The direction X is a direction along the long sides of the case 2 rectangular in plan view. The direction Y is a direction along the short sides of the case 2 rectangular in plan view. The direction Z is a direction along the height direction of the case 2. When the case 2 is placed on a horizontal plane, the directions X and Y form two horizontal directions (first and second horizontal directions) along two horizontal straight lines (X- and Y-axes) orthogonal to each other, and the direction Z forms a vertical direction (a height direction) along a vertical straight line (a Z-axis).

The case 2 integrally has a base portion 8, rectangular in plan view, having a uniform thickness and a frame portion 9, rectangular in plan view, uprighted from a peripheral edge portion of the base portion 8. In the semiconductor power module 1, semiconductor power devices 18, described later, are arranged on a region (a device region 16 described later) of the base portion 8 surrounded by the frame portion 9.

The base portion 8 and the frame portion 9 are made of a metallic material in the first embodiment. In particular, the base portion 8 and the frame portion 9 are preferably made of a metal such as aluminum or copper having high heat releasing characteristics.

A base 12 made of a resin material is mounted on the frame portion 9. The source sensing terminal 5 and the gate terminal 6 in the form of narrow columns are provided to extend inside and outside the case 2 through the base 12. The source sensing terminal 5 and the gate terminal 6 are so provided through the base 12 made of resin that the source sensing terminal 5 and the gate terminal 6 can be insulated from each other and from the frame portion 9 made of a metal.

The top plate 3 is a platelike body, in the form of a rectangle having a uniform thickness in plan view, separable from the case 2. The top plate 3 is made of a resin material in the first embodiment. The top plate 3, particularly preferably made of heat-resistant resin such as PPS (polyphenylene sulfide), may alternatively be made of a liquid crystal polymer or a ceramic material. The top plate 3 is fixed to the frame portion 9 with an adhesive or the like, for example.

The source terminal 4 is a platelike body (a plate terminal), in the form of a rectangle having a uniform thickness in plan view, elongated along the direction Y, and placed on the upper surface of the top plate 3.

In the top plate 3, a plurality of openings 14 (shown by two-dot chain lines in FIG. 1) smaller than the plane area of the source terminal 4 are formed in a region opposed to the source terminal 4. The plurality of openings 14 are formed in the same number as the semiconductor power devices 18 described later. According to the first embodiment, three openings 14 are arrayed in a triangular shape in plan view.

In the top plate 3, a through-hole 15 passing through the top plate 3 in the thickness direction is formed on a position between the source terminal 4 and the base 12. The through-hole 15 is in the form of an ellipse elongated along the direction Y in plan view in the first embodiment.

Figure 2:
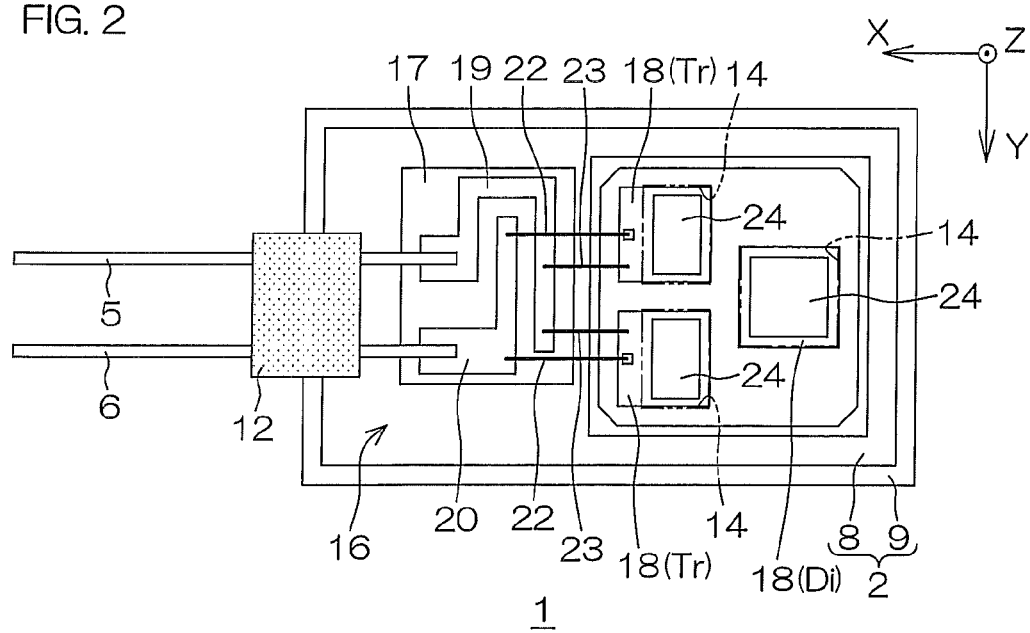
FIG. 2 illustrates the internal structure of the semiconductor power module shown in FIG. 1.
Figure 3:
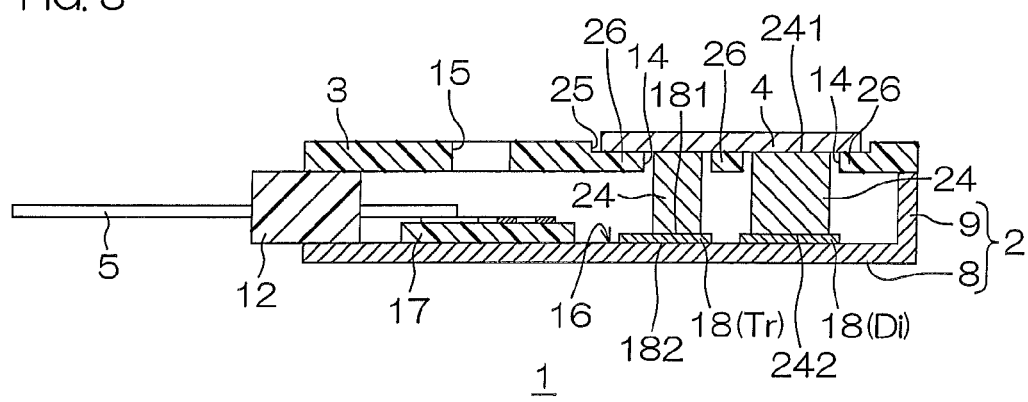
FIG. 3 is a sectional view of the semiconductor power module shown in FIG. 1, taken along a cutting plane line A-A in FIG. 1.

FIG. 2 illustrates the internal structure of the semiconductor power module 1 shown in FIG. 1. FIG. 3 is a sectional view of the semiconductor power module 1 shown in FIG. 1, taken along a cutting plane line A-A in FIG. 1.

In the case 2, an insulated substrate 17 and the plurality of semiconductor power devices 18 are arranged on the device region. 16 surrounded by the frame port on 9 in this order from the side closer to the base 12 along the direction Y.

The insulated substrate 17 is constituted of a ceramic substrate, for example. The insulated substrate 17 is a platelike body, in the form of a rectangle having a uniform thickness in plan view, elongated along the direction Y, and a platelike source sensing wire 19 and a platelike gate wire 20 are formed thereon at an interval from each other. An end of the source sensing terminal 5 is connected to the source sensing wire 19. An end of the gate terminal 6 is connected to the gate wire 20.

The plurality of semiconductor power devices 18 include a plurality of switching elements Tr and a plurality of diode elements Di. According to the first embodiment, the semiconductor power devices 18 include two switching elements Tr and one diode element Di. The semiconductor power devices 18 are devices employing an SiC semiconductor in the first embodiment. The plurality of semiconductor power devices 18 are arranged to be in one-to-one correspondence to the openings 14 of the top plate 3 respectively. More specifically, one diode element Di and the two switching elements Tr are arrayed in a triangular shape in plan view. Rear surfaces 182 of the plurality of semiconductor power devices 18 are bonded to the base portion 8 of the case 2, so that the semiconductor power devices 18 are electrically connected to the case 2.

Among the semiconductor power devices 18, the switching elements Tr are electrically connected to the gate wire 20 and the source sensing wire 19 through different Al wires 22 and 23 respectively.

Rear surfaces 242 of metal blocks 24 employed as wiring materials supplying power to the semiconductor power devices 18 are bonded one by one to surfaces 181 (opposite to the rear surfaces 182 bonded to the base portion 8) of the semiconductor power devices 18. The metal blocks 24 are in the form of rectangular parallelepipeds uprighted from the surfaces 181 of the semiconductor power devices 18 in a direction (approaching the source terminal 4) separating from the base portion 8 in the first embodiment.

The metal blocks 24 are preferably made of Cu or an alloy material (such as a CuMo alloy or a CuW alloy, for example) containing Cu. Thus, the difference between the linear expansion coefficients of SiC and the metal blocks 24 can be reduced as compared with a case of employing Al wires as wiring members for the SiC power devices 18. Therefore, thermal stress caused between the semiconductor power devices 18 and the metal blocks 24 can be reduced. Consequently, thermal fatigue of the semiconductor power devices 18 can be reduced, whereby a semiconductor power module 1 having a long life and high reliability can be attained. For example, the linear expansion coefficient of SiC is about 4.5 ppm/K, and that of a CuMo alloy is about 9.0 ppm/K (about twice the linear expansion coefficient of SiC). On the other hand, the linear expansion coefficient of Al is about 23 ppm/K (about five time the linear expansion coefficient of SiC). Surfaces 241 of the plurality of metal blocks 24 are bonded to the source terminal 4 through the openings 14 of the top plate 3.

In the top plate 3, a recess portion 25 having a contour along the shape of the source terminal 4 in plan view (overlapping with the source terminal 4 in plan view) is formed on the region opposed to the source terminal 4, and the source terminal 4 is fitted into the recess portion 25. The openings 14 for connecting the metal blocks 24 and the source terminal 4 with one another are formed to pass through a bottom. wall 26 of the recess portion 25. A portion, surrounding the openings 14, of the bottom wall 26 of the recess portion 25 as a support portion is in contact with the source terminal 4 from the side of the rear surface. Thus, a part of the source terminal 4 is supported by the metal blocks 24 due to the bonding, and most of the remaining parts are supported by the top plate 3 (the bottom wall 26 of the recess portion 25) entering the side of the rear surface thereof.

FIGS. 4A to 4E are sectional views successively illustrating manufacturing steps for the semiconductor power module 1 shown in FIG. 1.

Figure 4D:
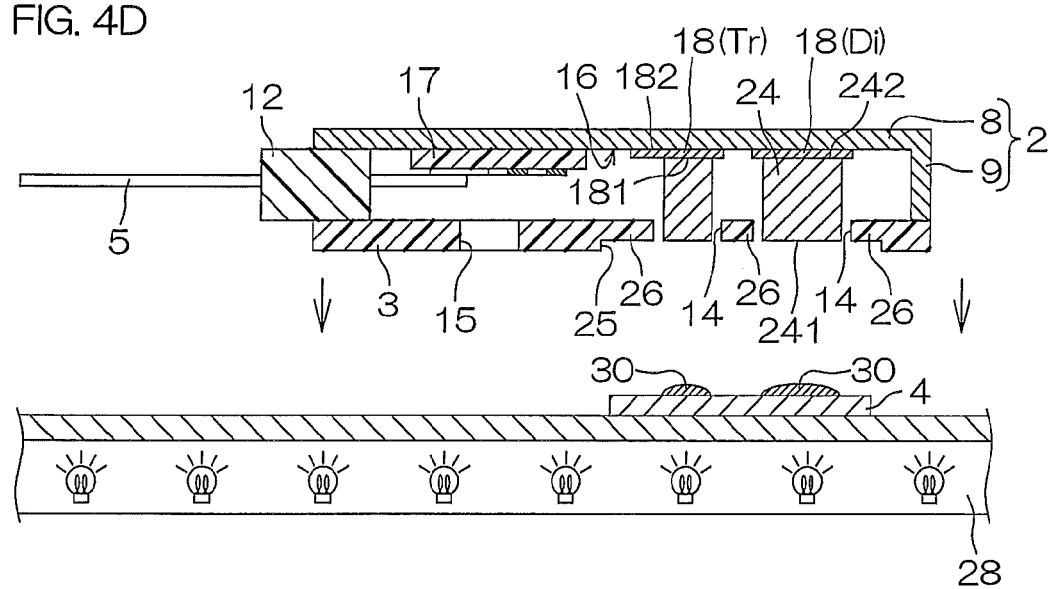

First, the insulated substrate 17 provided with the platelike wires 19 and 20 is mounted on the device region 16 in the case 2, as shown in FIG. 4A. Then, the base 12 having the source sensing terminal 5 and the gate terminal 6 inserted thereinto is mounted on the frame portion 9 of the case 2. Then, the source sensing terminal 5 and the gate terminal 6 and the platelike wires 19 and 20 are bonded to one another. Then, the semiconductor power devices 18 are set on the base portion 8 through plate solder members 27, for example. Then, the case 2 is set on a heater 28, and heated to 250 to 400° C., for example. Due to the heating, heat conducted to the case 2 made of a metal is transmitted to the plate solder members 27, to melt the plate solder members 27. Thus, the semiconductor power devices 18 are bonded to the base portion 8 of the case 2. FIGS. 4B to 4E omit illustration of the plate solder members 27 employed for the bonding.

Figure 4E:
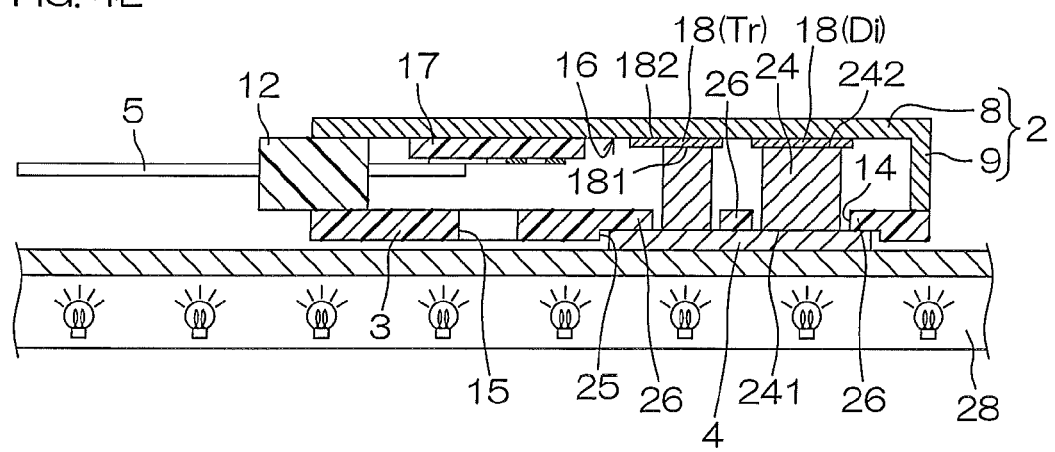

Then, while the case 2 is set on the heater 28, the metal blocks 24 are set on the surfaces 181 of the semiconductor power devices 18 through plate solder members 29, for example, as shown in FIG. 4B. Then, the case 2 is heated to 250 to 400° C., for example. Due to the heating, heat conducted to the case 2 made of a metal is transmitted to the plate solder members 29 through the semiconductor power devices 18, to melt the plate solder members 29. Thus, the metal blocks 24 are bonded to the semiconductor power devices 18. FIGS. 4C to 4E omit illustration of the plate solder members 29 employed for the bonding.

Then, the top plate 3 is positioned to align the openings 14 thereof with the metal blocks 24 respectively, and fixed to the frame portion 9, as shown in FIG. 4C.

Then, the source terminal 4 is singly placed on the heater 28, and preliminary solder members 30 are applied onto the source terminal 4, as shown in FIG. 4D. Then, the case 2 is inverted (so that the top plate 3 is directed downward) to position the metal blocks 24 on the preliminary solder members 30, thereby bringing the metal blocks 24 into contact with the preliminary solder members 30.

Then, the metal blocks 24 and the source terminal 4 are heated by the heater 28 to be bonded to one another, as shown in FIG. 4E.

According to the semiconductor power module 1, as hereinabove described, the metal blocks 24 larger in diameter than wires are employed as the wiring members for connecting the semiconductor power devices 18 and the source terminal with one another. Thus, the wires (the metal blocks 24) can be bonded to the semiconductor power devices 18 with large areas. Therefore, current concentration on the junctions between the wires (the metal blocks 24) and the semiconductor power devices 18 can be suppressed. Consequently, current can be leveled. Further, the metal blocks 24 and the platelike source terminal 4 can efficiently release heat generated in the semiconductor power devices 18, whereby the heat releasing effect can also be improved.

When the external terminal is the platelike source terminal 4 provided along the upper surface of the top plate 3 as in the first embodiment and the source terminal 4 is subjected to an external shock or the like, the shock may be transmitted to the semiconductor power devices 18 through the metal blocks 24, to break the semiconductor power devices 18 as a result.

According to the first embodiment, therefore, the bottom wall 26 of the recess portion 25 of the top plate 3 supports the source terminal 4 from the side of the rear surface thereof. Even if the source terminal 4 is subjected to a shock or the like, therefore, the bottom wall 26 of the recess portion 25 can absorb the shock. Consequently, the semiconductor power devices 18 can be absolutely protected against transmission of the shock, or the shock transmitted to the semiconductor power devices 18 can be reduced. Thus, the semiconductor power devices 18 can be prevented from breakage caused by the shock. According to the first embodiment, further, the support portion supporting the source terminal 4 is constituted of peripheral edge portions (the bottom wall 26 of the recess portion 25) of the openings 14 surrounding the metal blocks 24 in one-to-one correspondence along the plane contours of the metal blocks 24, whereby the shock transmitted from the source terminal 4 to the metal blocks 24 can be effectively absorbed.

The top plate 3 is separable from the frame portion 9. In order to manufacture the semiconductor power module 1, therefore, the semiconductor power devices 18 are first arranged on the device region 16 so that the metal blocks 24 can be bonded to the semiconductor power devices 18 while the top plate 3 is separated from the frame portion 9. Therefore, the semiconductor power module 1 can be manufactured with excellent workability.

The rear surfaces 182 of the semiconductor power devices 18 are directly bonded to the base portion 8 made of a metal, whereby electrical contact with the rear surfaces 182 (drain sides) of the semiconductor power devices 18 can be attained through the case 2 of the semiconductor power module 1.

The top plate 3 is provided with the through-hole 15, whereby an insulated state in the case 2 can be simply maintained by pouring resin into the case 2 from the through-hole 15.

When the metal blocks 24 having a high heat releasing effect are utilized as the wire materials for the semiconductor power devices 18 as in the first embodiment, heat may be released through the metal blocks 24 having a high heat releasing effect if the source terminal 4 is heated with the heater 28 while the plate solder members 27 or 29 are held between the metal blocks 24 and the source terminal 4 as in the step shown in FIG. 4A or 4B, for example. Consequently, the previously held plate solder members 27 or 29 may not be excellently melted, but the metal blocks 24 and the source terminal 4 may be defectively bonded to one another.

According to the first embodiment, therefore, the preliminary solder members 30 are previously applied to the source terminal 4 so that the metal blocks 24 are brought into contact with and bonded to the portions provided with the preliminary solder members 30, as shown in FIG. 4D. Thus, the metal blocks 24 and the source terminal 4 can be excellently bonded to one another. In other words, the semiconductor power module 1 can be simply manufactured in high quality.

Figure 5:
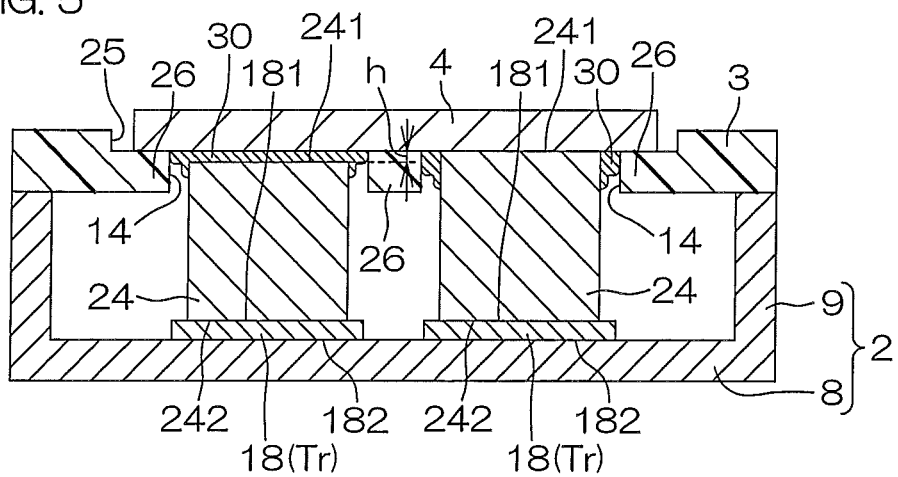
FIG. 5 is a sectional view of the semiconductor power module shown in FIG. 1, taken along a cutting plane line A'-A' in FIG. 1.

Even if a vertical difference h is caused between the plurality of metal blocks 24 as shown in FIG. 5, for example, a prescribed volume of preliminary solder members 30 can compensate for the vertical difference h according to the method. Consequently, the platelike source terminal 4 can be collectively reliably bonded to the plurality of metal blocks 24.

<Second Embodiment>

Figure 6:
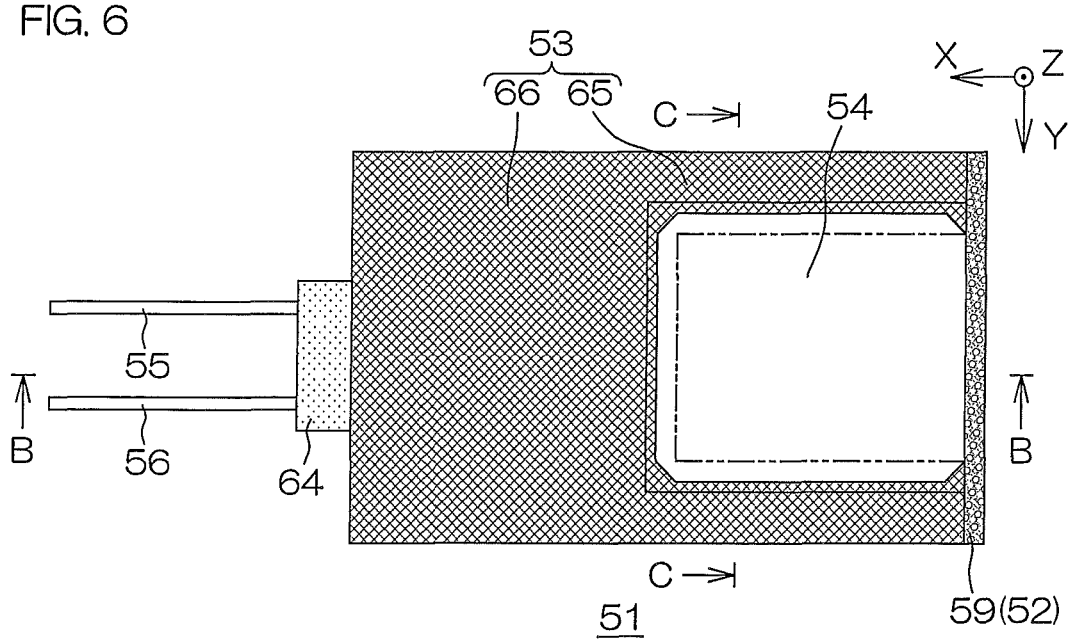
FIG. 6 illustrates the overall structure of a semiconductor power module according to a second embodiment of the present invention.
Figure 6:
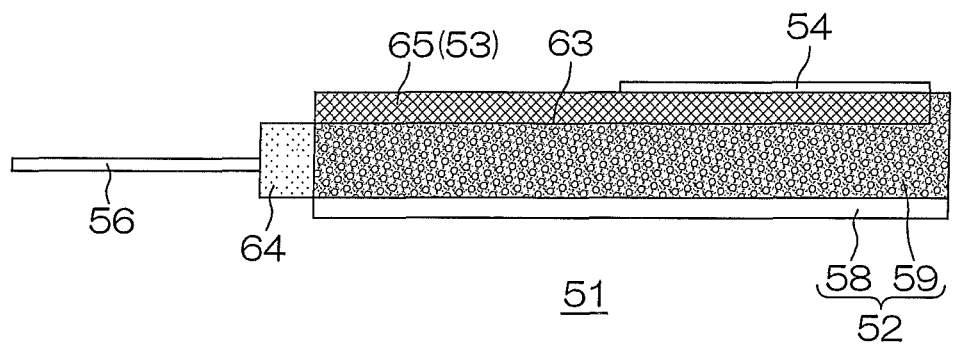
Figure 6:
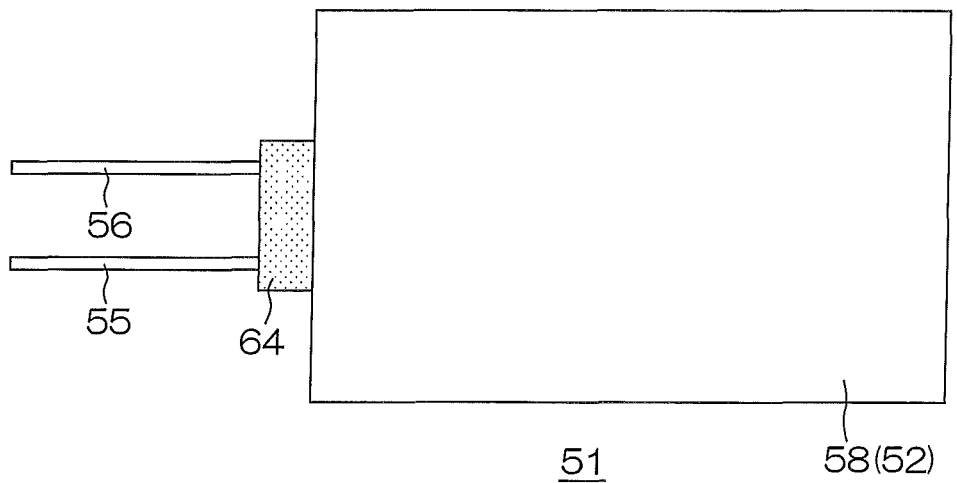
Figure 7:
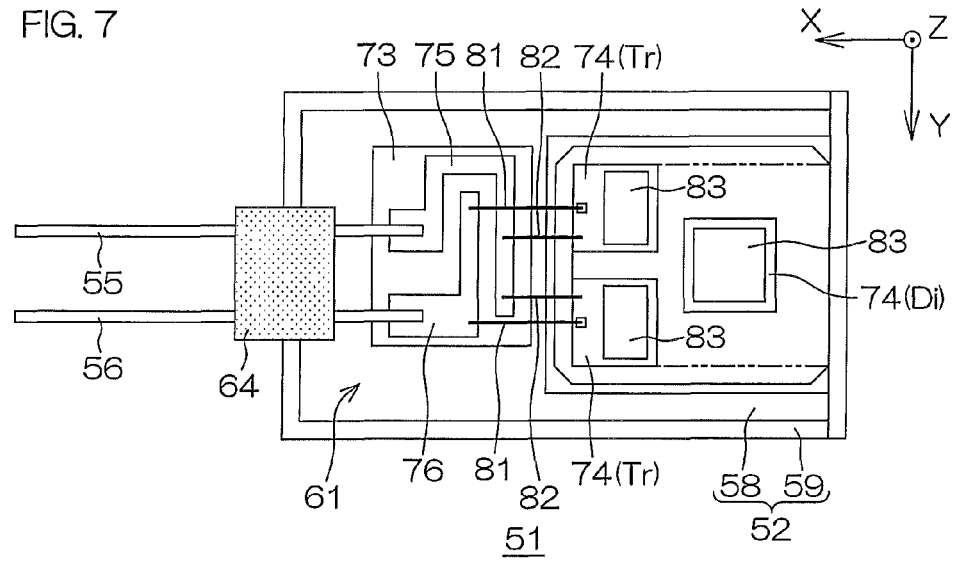
FIG. 7 illustrates the internal structure of the semiconductor power module shown in FIG. 7.
Figure 8:
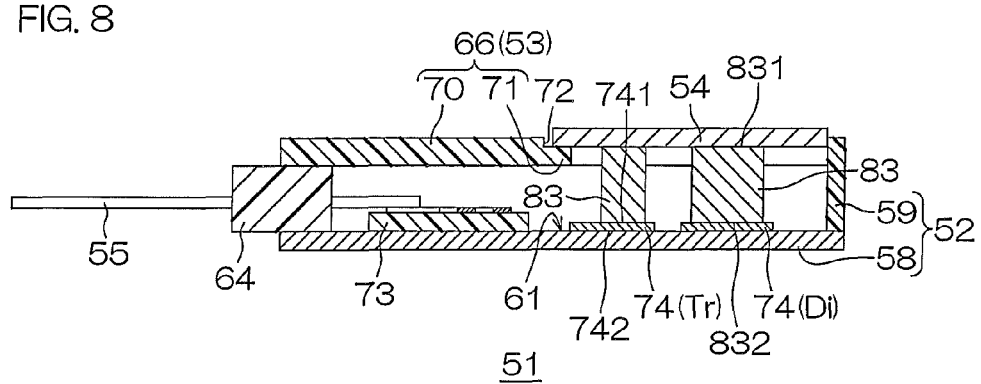
FIG. 8 is a sectional view of the semiconductor power module shown in FIG. 6, taken along a cutting plane line B-B in FIG. 6.
Figure 9:
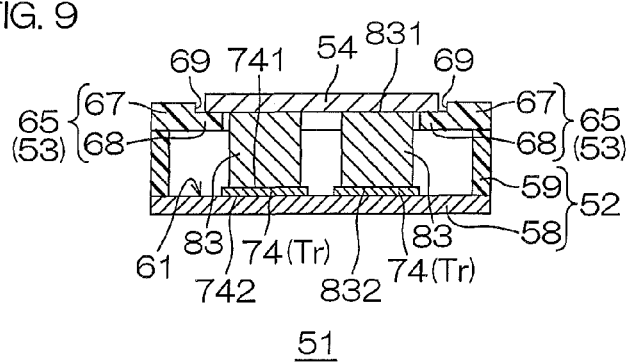
FIG. 9 is a sectional view of the semiconductor power module shown in FIG. 6, taken along a cutting plane line C-C in FIG. 6.

FIG. 6 illustrates the overall structure of a semiconductor power module according to a second embodiment of The present invention. FIG. 7 illustrates the internal structure of the semiconductor power module shown in FIG. 6. FIG. 8 is a sectional view of the semiconductor power module shown in FIG. 6, taken along a cutting plane line B-B in FIG. 6. FIG. 9 is a sectional view of the semiconductor power module shown in FIG. 6, taken along a cutting plane line C-C in FIG. 6.

A power module 51 includes a case 52 having an open surface, a top plate 53 blocking the open surface of the case 52, a source terminal 54 as an external terminal, a source sensing terminal 55, and a gate terminal 56.

For the convenience of illustration, directions X, Y and Z shown in FIG. 6 may hereinafter be employed. The direction X is a direction along the long sides of the case 52 rectangular in plan view. The direction Y is a direction along the short sides of the case 52 rectangular in plan view. The direction Z is a direction along the height direction of the case 52. When the case 52 is placed on a horizontal plane, the directions X and Y form two horizontal directions (first and second horizontal directions) along two horizontal straight lines (X- and Y-axes) orthogonal to each other, and the direction Z forms a vertical direction (a height direction) along a vertical straight line (a Z-axis).

The case 52 has a base portion 58, rectangular in plan view, having a uniform thickness and a frame portion 59, rectangular in plan view, uprighted from a peripheral edge portion of the base portion 58. In the semiconductor power module 51, semiconductor power devices 74, described later, are arranged on a region (a device region 61) of the base portion 58 surrounded by the frame portion 59.

The base portion 58 is made of a metallic material in the second embodiment. In particular, the base portion 58 is preferably made of a metal such as aluminum or copper having high heat releasing characteristics.

On the other hand, the frame portion 59 is made of a resin material in the second embodiment. The frame portion 59, particularly preferably made of heat-resistant resin such as PPS (polyphenylene sulfide), may alternatively be made of a liquid crystal polymer or a ceramic material.

The frame portion 59 is provided with a low-stage portion 63, having a constant depth, lower by one stage than a top portion thereof. The low-stage portion 63, U-shaped in plan view, is a portion for sliding the top plate 53 also U-shaped in plan view. The depth of the low-stage portion 63 is preferably generally identical to the thickness of the top plate 53, or example. Thus, the frame portion 59 and the top plate 53 can form a rectangular parallelepiped having a planar surface when the top plate 53 is fixed.

A base 64 made of a resin material is mounted on the frame portion 59. The source sensing terminal 55 and the gate terminal 56 in the form of narrow columns are provided to extend inside and outside the case 52 through the base 64. The source sensing terminal 55 and the gate terminal 56 are so provided through the base 64 made of resin that the source sensing terminal 55 and the gate terminal 56 can be insulated from each other and from the frame portion 59 made of a metal.

The top plate 53 is a platelike body, in the form of a rectangle having a uniform thickness in plan view, separable from the case 52. The top plate 53 is made of a resin material in the second embodiment. The top plate 53, particularly preferably made of heat-resistant resin such as PPS (polyphenylene sulfide), may alternatively be made of a liquid crystal polymer or a ceramic material.

The source terminal 54 is a platelike body (a plate terminal), in the form of a rectangle having a uniform thickness in plan view, elongated along the direction Y, and provided to be opposed to the device region 61 of the base portion 58.

The top plate 53 has a pair of arm portions 65 along the long sides of the source terminal 54 as first opposite sides and a coupling portion 66 coupling portions of the pair of arm portions 65 on a side of the source terminal 51 closer to the source sensing terminal 55 with each other. The top plate 53 is provided to surround three sides in the periphery of the source terminal 54 with the arm portions 65 and the coupling portion 66, and has a blocked end blocked with the coupling portion 66 on the side closer to the source sensing terminal 55 in the direction X and an open end opposite thereto. Thus, the top plate 53 is supported by the frame portion 59, to be slidable in a sliding direction (the direction X) along a direction where a coupling end separates from the source terminal 54.

As shown in FIG. 9, the pair of arm portions 54 have first portions 67 coming into contact with a peripheral edge portion of the source terminal 54 from outside in a transverse direction (the direction Y) orthogonal to the sliding direction and second portions 68 projecting from lower ends of the first portions 67 along the rear surface of the source terminal 54 respectively. Thus, the peripheral edge portion of the source terminal 54 along the log sides fits into a recess portion 69 partitioned by the first portions 67 of the arm portions 65 and the second portions 68 of the arm portions 65.

As shown in FIG. 8, the coupling portion 66 has a first portion 70 coming into contact with the peripheral edge portion of the source terminal 54 from outside in the sliding direction (the direction X) and a second portion 71 projecting from a lower end of the first portion 70 along the rear surface of the source terminal 54. Thus, the peripheral edge portion of the source terminal 54 along the short sides as second opposite sides fits into a recess portion 72 partitioned by the first portion 70 of the coupling portion 66 and the second portion 71 of the coupling portion 66.

In other words, the source terminal 51 is supported by the arm portions 65 and the coupling portion 66 on a position U-shaped in plan view.

In the case 52, an insulated substrate 73 and the plurality of semiconductor power devices 74 are arranged on the device region 61 surrounded by the frame portion 59 in this order from the side of the base 64 along the direction Y.

The insulated substrate 73 is constituted of a ceramic substrate, for example. The insulated substrate 73 is a platelike body, in the form of a rectangle having a uniform thickness in plan view, elongated along the direction Y, and a platelike source sensing wire 75 and a platelike gate wire 76 are formed thereon at an interval from each other. An end of the source sensing terminal 55 is connected to the source sensing wire 75. An end of the gate terminal 56 is connected to the gate wire 76.

The plurality of semiconductor power devices 74 include a plurality of switching elements Tr and a plurality of diode elements Di. According to the second embodiment, the semiconductor power devices 74 include two switching elements Tr and one diode element Di. The semiconductor power devices 74 are devices employing an SiC semiconductor in the second embodiment. In the plurality of semiconductor power devices 74, two switching elements Tr are arranged at an interval from each other along the direction Y, and one diode element Di is arranged on a side of the switching elements Tr opposite to the insulated substrate 73 in the direction X. More specifically, one diode element Di and the two switching elements Tr are arrayed in a triangular shape in plan view. Rear surfaces 742 of the plurality of semiconductor power devices 74 are bonded to the base portion 58 of the case 52, so that the semiconductor power devices 74 are electrically connected to the case 52.

Among the semiconductor power devices 74, the switching elements Tr are electrically connected to the gate wire 76 and the source sensing wire 75 through different Al wires 81 and 82 respectively.

Rear surfaces 832 of metal blocks 83 employed as wiring materials supplying power to the semiconductor power devices 74 are bonded one by one to surfaces 741 (opposite to the rear surfaces 742 bonded to the base portion 58) of the semiconductor power devices 74. The metal blocks 83 are in the form of rectangular parallelepipeds uprighted from the surfaces 741 of the semiconductor power devices 74 in a direction (approaching the source terminal 54) separating from the base portion 58 in the second embodiment.

The metal blocks 83 are preferably made of Cu or an alloy material (such as a CuMo alloy or a CuW alloy, for example) containing Cu. Thus, the difference between the linear expansion coefficients of SiC and the metal blocks 83 can be reduced as compared with a case of employing Al wires as wiring members for the SiC power devices 71. Therefore, thermal stress caused between the semiconductor power devices 74 and the metal blocks 83 can be reduced. Consequently, thermal fatigue of the semiconductor power devices 74 can be reduced, whereby a semiconductor power module 51 having a long life and high reliability can be attained. For example, the linear expansion coefficient of SiC is about 4.5 ppm/K, and that of a CuMo alloy is about 9.0 ppm/K (about twice the linear expansion coefficient of SiC). On the other hand, the linear expansion coefficient of Al is about 23 ppm/K (about five times the linear expansion coefficient of SiC). Surfaces 831 of the plurality of metal blocks 83 are bonded to the source terminal 54 in a region of the top plate 53 surrounded by the arm portions 65 and the coupling portion 66.

FIGS. 10A to 10E are sectional views successively illustrating manufacturing steps for the semiconductor power module 51 show in FIG. 6.

Figure 10A:
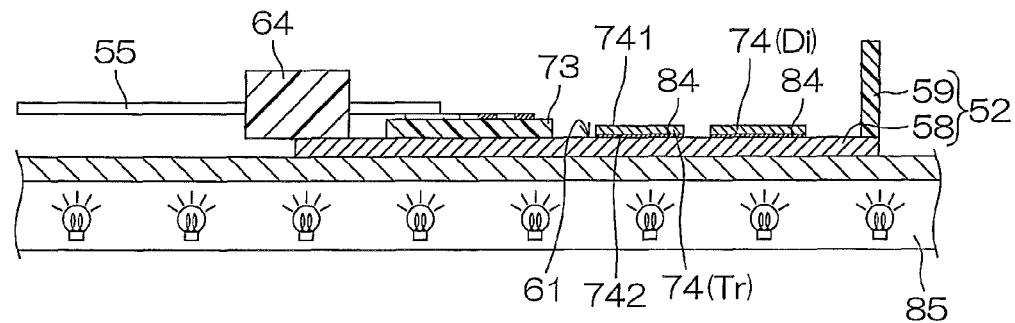
FIGS. 10A to 10E are sectional views, taken along the cutting plane line B-B in FIG. 6 similarly to FIG. 8, successively showing partial manufacturing steps for the semiconductor power module shown in FIG. 6.

First, the insulated substrate 73 provided with the platelike wires 75 and 76 is mounted on the device region 61 in the case 52, as shown in FIG. 10A Then, the base 64 having the source sensing terminal 55 and the gate terminal 56 inserted thereinto is mounted on the frame portion 59 of the case 52. Then, the source sensing terminal 55 and the gate terminal 56 and the platelike wires 75 and 76 are bonded to one another. Then, the semiconductor power devices 74 are set on the base portion 58 through plate solder members 84, for example. Then, the case 52 is set on a heater 85, and heated to 250 to 400° C., for example. Due to the heating, heat conducted to the base portion 58 made of a metal is transmitted to the plate solder members 84, so melt the plate solder members 84. Thus, the semiconductor power devices 74 are bonded to the base portion 58 of the case 52. FIGS. 10B to 10E omit illustration of the plate solder members 84 employed for the bonding.

Figure 10B:
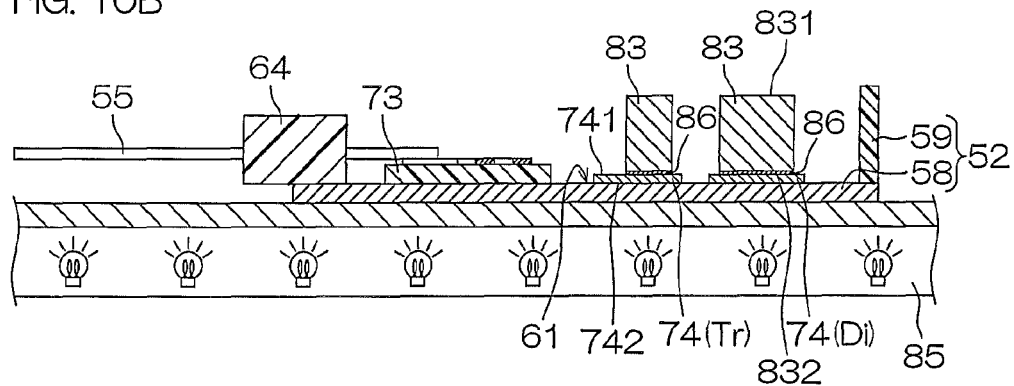

Then, while the case 52 is set on the heater 85, the metal blocks 83 are set on the surfaces 741 of the semiconductor power devices 74 through plate solder members 36, for example, as shown in FIG. 10B. Then, the case 52 is heated to 250 to 400° C., for example. Due to the heating, heat conducted to the base portion 58 made of a metal is transmitted to the plate solder members 86 through the semiconductor power devices 74, to melt the plate solder members 86. Thus, the metal blocks 83 are bonded to the semiconductor power devices 74, FIGS. 10C to 10E omit illustration of the plate solder members 86 employed for the bonding.

Figure 10C:
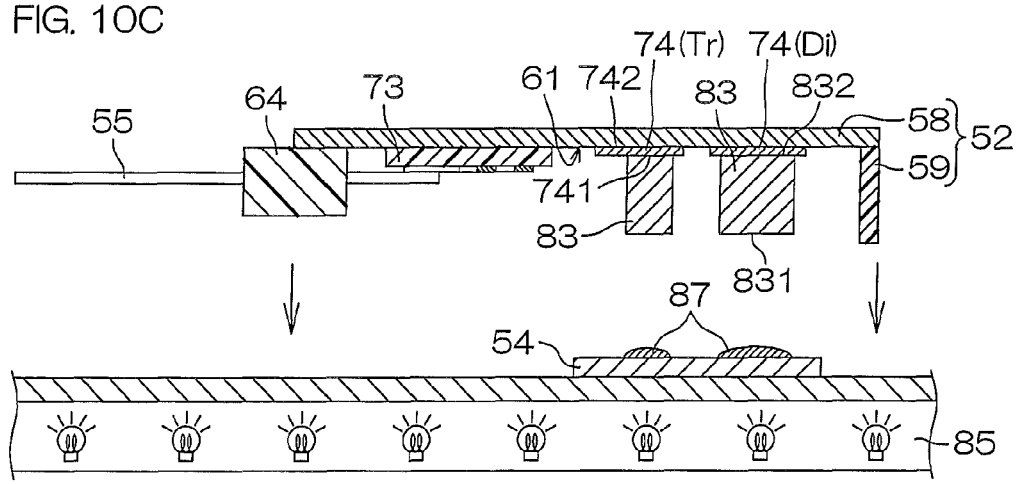

Then, the source terminal 54 is singly placed on the heater 85, and preliminary solder members 87 are applied onto the source terminal 54, as shown in FIG. 10C, Then, the case 52 is inverted to position the metal blocks 83 on the preliminary solder members 67, thereby bringing the metal blocks 83 and the preliminary solder members 87 into contact with one another.

Figure 10D:
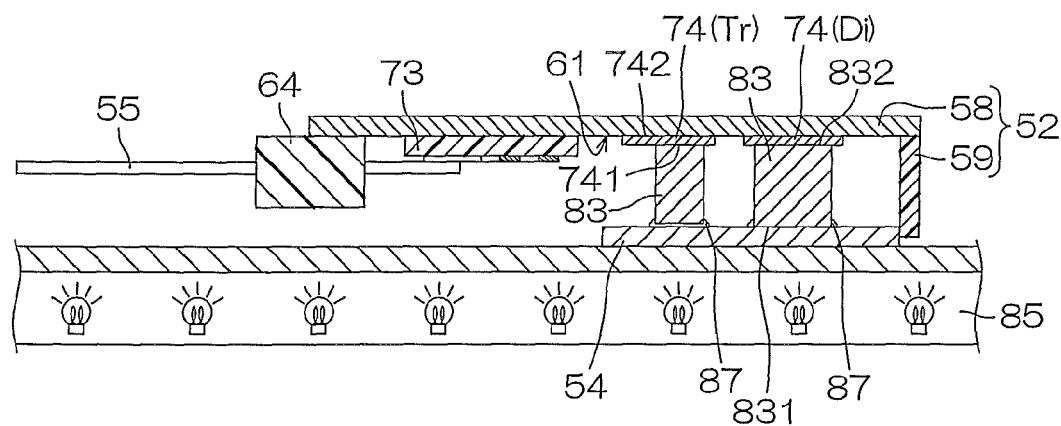

Then, the metal blocks 83 and the source terminal 54 are heated by the heater 85 to be bonded to one another, as shown in FIG. 10D.

Figure 10E:
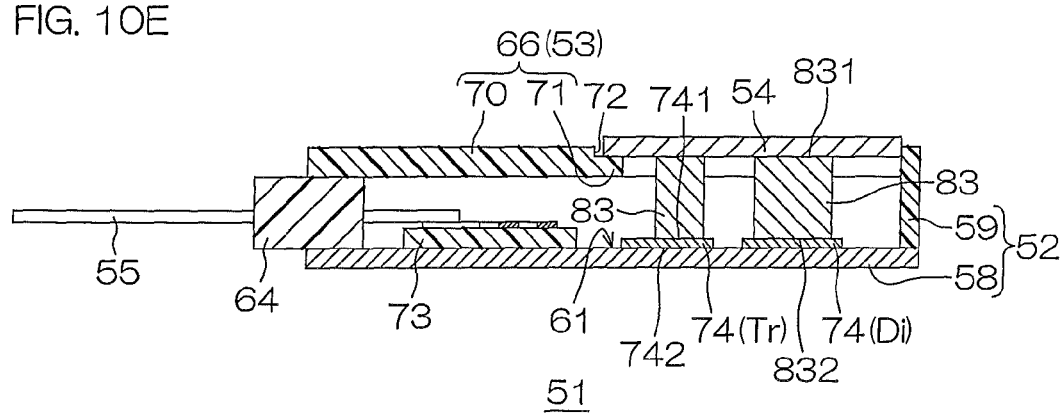

Then, the sop plate 53 is positioned to align the recess portion 72 thereof with the peripheral edge portion of the source terminal 54, and the top plate 53 is slid with respect to the frame portion 59 until she coupling portion 66 thereof comes into contact with the source terminal 54, as shown in FIG. 10E. Thus, the device region 61 is blocked.

According so the semiconductor power module 51, as hereinabove described, the metal blocks 83 larger in diameter than wires are employed as the wiring members for connecting the semiconductor power devices 74 and the source terminal 54 with one another. Thus, the wires (the metal blocks 83) can be bonded to the semiconductor power devices 74 with large areas. Therefore, current concentration on the junctions between the wires (the metal blocks 83) and the semiconductor power devices 74 can be suppressed. Consequently, current can be leveled. Further, the metal blocks 83 and the platelike source terminal 54 can efficiently release heat generated in the semiconductor power devices 74, whereby a heat releasing effect can also be improved.

When the external terminal is the platelike source terminal 54 provided along the upper surface of the top plate 53 as in the second embodiment and the source terminal 54 is subjected to an external shock or the like, the shock may be transmitted to the semiconductor power devices 74 through the metal blocks 83, to break the semiconductor power devices 74 as a result.

According to the second embodiment, therefore, the second portions 68 and 71 of the arm portions 65 and the coupling portion 66 of the top plate 53 support the source terminal 54 from the side of the rear surface thereof. Even if the source terminal 54 is subjected to a shock or the like, therefore, the arm portions 65 and the coupling portion 66 can absorb the shock. Consequently, the semiconductor power devices 74 can be absolutely protected against transmission of the shock, or the shock transmitted to the semiconductor power devices 74 can be reduced. Thus, the semiconductor power devices 74 can be prevented from breakage caused by the shock.

The top plate 53 is slidably supported by the frame portion 59, and separable from the frame portion 59. In order to manufacture the semiconductor power module 51, therefore, the semiconductor power devices 74 are first arranged. on the device region 61 so that the metal blocks 83 can be bonded to the semiconductor power devices 74 while the top plate 53 is separated from the frame portion 59. Therefore, the semiconductor power module 51 can be manufactured with excellent workability. Further, an end portion of the top plate 53 opposite to the direction where the same is extracted by sliding is open. Also after the top plate 53 is fixed to the frame portion 59, therefore, the device region 61 can be exposed by extracting the top plate 53 without detaching the metal blocks 83 from the source terminal 54. Consequently, maintenance in the case 52 can be easily performed.

The peripheral edge portion along the long sides of the source terminal 54 fits into the recess portion 69 partitioned by the first potions 67 of the arm portions 65 and the second portions 68 of the arm portions 65. When the top plate 53 is slid along the frame portion 59, therefore, the source terminal 54 can be utilized as a guide member for guiding the top plate 53. Therefore, the top plate 53 can be easily positioned.

The peripheral edge portion along the short sides (opposite sides orthogonal to the sliding direction) of the source terminal 54 fits into the recess portion 72 partitioned by the first portion 70 of the coupling portion 66 and the second portion 71 of the coupling portion 66. When the top plate 53 is slid along the frame portion 59, therefore, the sliding of the top plate 53 can be stopped by bringing the peripheral edge portion of the source terminal 54 into contact with the first portion 70 of the coupling portion 66 of the top plate 53. in other words, the source terminal 54 can also be utilized as a stopper member for stopping the sliding of the top plate 53. Therefore, the top plate 53 can be more easily positioned.

The rear surfaces 742 of the semiconductor power devices 74 are directly bonded to the base portion 58 made of a metal, whereby electrical contact with the rear surfaces 742 (drain sides) of the semiconductor power devices 74 can be attained through the case 52 of the semiconductor power module 51.

When the metal blocks 83 having a high heat releasing effect are utilized, as the wire materials for the semiconductor power devices 74 as in the second embodiment, heat may be released through the metal blocks 83 having a high heat releasing effect if the source terminal 54 is heated with the heater 85 while the plate solder members 84 or 86 are held between the metal blocks 83 and the source terminal 54 as in the step shown in FIG. 10A or 10B, for example. Consequently, the previously held plate solder members 84 or 86 may not be excellently melted, but the metal blocks 83 and the source terminal 54 may be defectively bonded to one another.

According to the second embodiment, therefore, the preliminary solder members 87 are previously applied to the source terminal 54 so that the metal blocks 83 are brought into contact with and bonded so the portions provided with the preliminary solder members 87, as shown in FIG. 10C. Thus, the metal blocks 83 and the source terminal 54 can be excellently bonded to one another. In other words, the semiconductor power module 51 can be simply manufactured in high quality.

Even if the vertical difference h shown in FIG. 5 is caused between the plurality of metal blocks 83 as described in the aforementioned first embodiment, for example, a prescribed volume of preliminary solder members 87 can compensate for the vertical difference h according to the method. Consequently, the platelike source terminal 54 can be collectively reliably bonded to the plurality of metal blocks 83.

While the embodiments of the present invention have been described, the present invention may be embodied in other ways.

Figure 11:
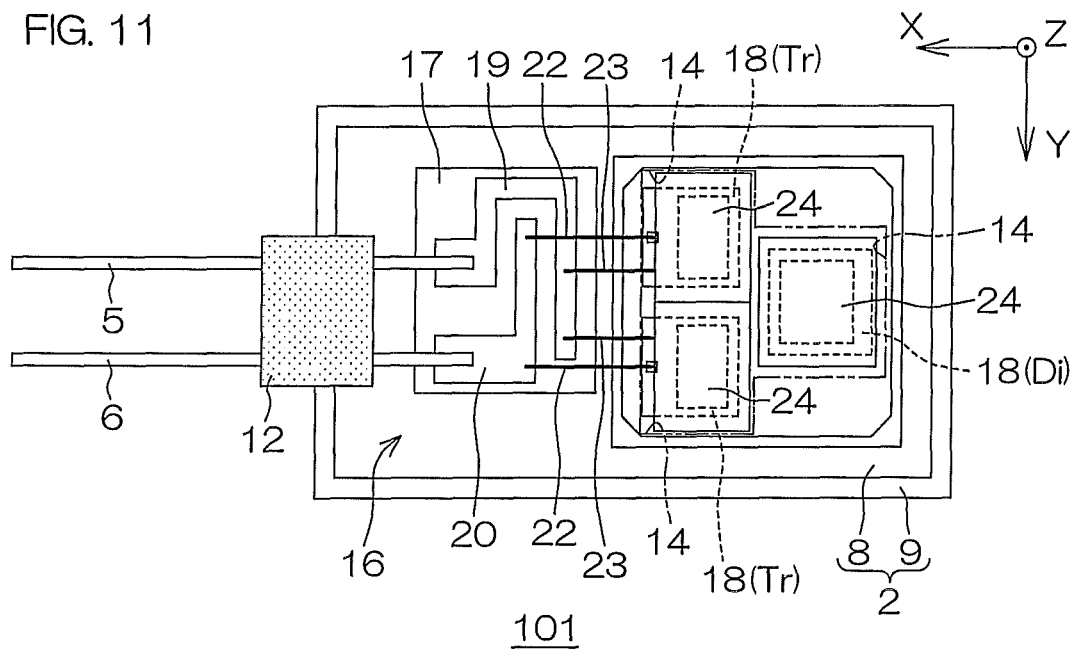
FIG. 11 illustrates the internal structure of a semiconductor power module according to a modification of a metal block shown in FIG. 2.
Figure 12:
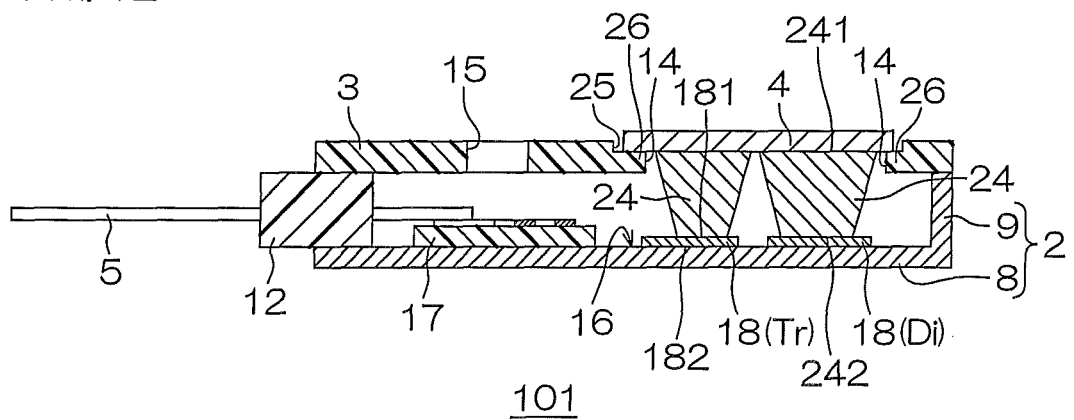
FIG. 12 is a sectional view of the semiconductor power module according to the modification of the metal block shown in FIG. 3.

For example, the metal blocks 24 may alternatively have tapered shapes whose sectional areas spread from the rear surfaces 242 toward the surfaces 241 thereof, as in a power module 101 shown in FIGS. 11 and 12.

Further, the material for the metal blocks 24 or 83 may alternatively be prepared from a metallic material such as Cu, Al or Fe.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2010-219030 filed with the Japan Patent Office on Sep. 29, 2010, the disclosure of which is incorporated herein by reference.

What is claimed is:

1. A semiconductor device comprising:
a base member;
an SiC semiconductor having a bonding surface and a rear surface with the rear surface bonded to the base member;
a metal block, having a bonding surface and a rear surface with the rear surface of the metal block being bonded to the bonding surface of the SiC semiconductor, uprighted from the bonding surface of the SiC semiconductor in a direction separating from the base member and employed as a wiring member for the SiC semiconductor;
an external terminal bonded to the bonding surface of the metal block and employed as a terminal for the SiC semiconductor;
an insulated substrate; and
a wiring, formed on an upper surface of the insulated substrate, being connected to the bonding surface of the SiC semiconductor.

2. The semiconductor device according to claim 1, wherein the SiC semiconductor includes a plurality of SiC semiconductors, and the bonding surface of the SiC semiconductors is a plurality of bonding surfaces, wherein
the external terminal is commonly connected to the bonding surfaces of the plurality of SiC semiconductors.

3. The semiconductor device according to claim 1, wherein the metal block is made of Cu or an alloy material containing Cu.

4. The semiconductor device according to claim 1, further comprising a second semiconductor power device being a different device type from that of the SiC semiconductor.

5. The semiconductor device according to claim 1, wherein the metal block is in the form of a rectangular parallelepiped.

6. The semiconductor device according to claim 1, wherein the metal block has a tapered shape whose sectional area spreads from the rear surface of the metal block toward the bonding surface of the metal block.

7. The semiconductor device according to claim 2, wherein the metal block includes a plurality of metal blocks bonded to each of the SiC semiconductors, and the rear surface of the metal blocks includes a plurality of rear surfaces, the rear surfaces of the metal blocks being bonded to the bonding surfaces of the plurality of the SiC semiconductors, respectively, wherein
the external terminal is collectively bonded to the metal blocks.

8. The semiconductor device according to claim 1, further comprising:
a case having
a base portion provided with a device region where the SiC semiconductor is arranged, and
a frame portion fixed to the base portion for surrounding the device region; and
a top plate, made of resin, fixed to the frame portion of the case and opposed to the device region, wherein
the external terminal includes a plate terminal provided along the top plate,
the top plate has a support portion overlapping with the plate terminal in a plan view for supporting the plate terminal from a side of a rear surface of the plate terminal,
the top plate is provided with a through-hole passing through the top plate in a thickness direction of the top plate in a region other than a region overlapping with the plate terminal in the plan view.

9. The semiconductor device according to claim 1, further comprising a second semiconductor power device having a thickness different from that of the SiC semiconductor.

10. A semiconductor device comprising:
a base member;
a semiconductor power device having a bonding surface and a rear surface with the rear surface bonded to the base member;
a metal column, having a bonding surface and a rear surface with the rear surface of the metal column being bonded to the bonding surface of the semiconductor power device, uprighted from the bonding surface of the semiconductor power device in a direction separating from the base member and employed as a wiring member for the semiconductor power device;
an external terminal bonded to the bonding surface of the metal column and employed as a terminal for the semiconductor power device;
an insulated substrate; and
a wiring, formed on an upper surface of the insulated substrate, being connected to the bonding surface of the semiconductor power device.

11. The semiconductor device according to claim 10, wherein the semiconductor power device is employing an SiC semiconductor.

12. The semiconductor device according to claim 10, wherein the metal column is comprised of a metal block.

13. A semiconductor device comprising:
a base member;
a semiconductor power device having a bonding surface and a rear surface with the rear surface bonded to the base member;
a metal block, having a bonding surface and a rear surface with the rear surface of the metal block being bonded to the bonding surface of the semiconductor power device, uprighted from the bonding surface of the semiconductor power device in a direction separating from the base member and employed as a wiring member for the semiconductor power device;
an external terminal bonded to the bonding surface of the metal block and employed as a terminal for the semiconductor power device;
a case having
   a base portion provided with a device region where the semiconductor power device is arranged, and
   a frame portion fixed to the base portion for surrounding the device region; and
   a top plate, made of resin, fixed to the frame portion of the case and opposed to the device region, wherein
the external terminal includes a plate terminal provided along the top plate,
the top plate has a support portion overlapping with the plate terminal in a plan view for supporting the plate terminal from a side of a rear surface of the plate terminal, and
the top plate is provided with a through-hole passing through the top plate in a thickness direction of the top plate in a region other than a region overlapping with the plate terminal in the plan view.

14. The semiconductor device according to claim 13, wherein the semiconductor power device is employing an SiC semiconductor.

* * * * *